(12) United States Patent
Horikawa

(10) Patent No.: US 6,562,733 B2
(45) Date of Patent: *May 13, 2003

(54) SEMICONDUCTOR DEVICE MANUFACTURING METHOD

(75) Inventor: Mitsuhiro Horikawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,170

(22) Filed: Sep. 30, 1998

(65) Prior Publication Data
US 2002/0037632 A1 Mar. 28, 2002

(30) Foreign Application Priority Data
Sep. 30, 1997 (JP) ............................. 9-265575

(51) Int. Cl.⁷ ..................... H01L 21/31; H01L 21/322
(52) U.S. Cl. ...................................... 438/787; 438/471
(58) Field of Search ................. 438/473, 470, 438/471, 472, 474, 476, 475, 477, 758, 770, 787

(56) References Cited

U.S. PATENT DOCUMENTS

| | | | |
|---|---|---|---|
| 4,053,335 A | * 10/1977 | Hu | 140/DIG. 122 |
| 4,782,029 A | * 11/1988 | Takemura et al. | 438/143 |
| 4,955,808 A | * 9/1990 | Miyagawa | 414/940 |
| 5,773,152 A | * 6/1998 | Okonogi | 438/446 |
| 5,851,892 A | * 12/1998 | Lojek et al. | 438/305 |
| 5,940,722 A | * 8/1999 | Tamura | 438/471 |
| 5,973,386 A | * 10/1999 | Horikawa | 257/655 |

FOREIGN PATENT DOCUMENTS

| | | |
|---|---|---|
| EP | 0562783 A1 | 9/1993 |
| EP | 0604234 A2 | 6/1994 |
| JP | 52-116079 | 9/1977 |
| JP | 3-77330 | 4/1991 |
| JP | 5-129310 | 5/1993 |
| JP | 5-275436 | 10/1993 |
| JP | 6-196490 | 7/1994 |
| JP | 7-335656 | 12/1995 |

OTHER PUBLICATIONS

Chinese Office Action dated Mar. 29, 2002; application No. 98120065.6; Applicant: NEC Corporation; Title of Invention: Semiconductor Device Manufacturing Method.
H. Tsuya, *ULSI Process Control Engineering*, pp. 194–195, 198–201, 204–205, 224–225, (Mar. 1995).
Y. Shiramizu et al., *Effect of Metals (Fe,Cu) on 8–nm–Thick Gate Oxide Reliability*, pp. 362–364, (1996).
W.B. Henley, Journal of Non–Crystalline Solids, *Effects of iron contamination in silicon on thin oxide breakdown and reliability characteristics*, 187, pp. 134–139, (1995).
M. Koyanagi, *Submicron Device II*, pp. 78–79, (Jan. 1988).

* cited by examiner

*Primary Examiner*—Olik Chaudhuri
*Assistant Examiner*—Brook Kebede
(74) *Attorney, Agent, or Firm*—Foley & Lardner

(57) ABSTRACT

There is prepared a wafer (10) having a gettering capability such as PBS wafer having deposition of polysilicon on its back surface thereof, IG wafer containing oxygen precipitates. An element separation silicon oxide film (2) is formed on the wafer (10), and a first silicon oxide film (3) is formed on the wafer (10). Then the wafer (10) is gradually cooled to a low temperature, or the wafer (10) is cooled to a low temperature and then kept at the low temperature for a fixed time. Thereafter, the first silicon oxide film (3) is remoeved from the wafer (10) and then the wafer (30) is cleaned. Thereafter, a gate silicon oxide film (4) and a gate electrode (5) are formed. Subsequently, ion implantation to form a source (6) and a drain (7) and a heat treatment to activate implanted impurities are performed to form a basic MOS transistor.

12 Claims, 5 Drawing Sheets

SEMICONDUCTOR DEVICE MANUFACTURING METHOD

BACKGROUND OF THE INVENTION

1. Field of the Invention

The present invention relates to a semiconductor device manufacturing device, and particularly to a method of removing heavy metal impurities when MOS transistor is formed on a silicon wafer.

2. Description of the Related Art

In a process of manufacturing semiconductor devices, the surface and the inside of silicon wafer are contaminated with impurities of heavy metal in some cases. The contamination occurs in a high-temperature heat treatment step, an ion implantation step, an etching step, etc. It is known that if impurities of heavy metal are segregated into a silicon oxide film, reliability of the insulation characteristics represented by TDDB (Time Dependent Dielectric Breakdown) characteristic, etc. is degraded.

A gettering technique is known as one of methods of preventing degradation of the reliability of oxide films due to heavy metal impurities. According to this technique, heavy metal which is included in silicon wafer is removed from the sub-surface of the wafer and captured so that the heavy metal is not taken into a gate oxide film when the gate oxide film is formed on the surface of the wafer. For example, as described in "ULSI Process Control Engineering" (written by Hideki Tsuya and issued in 1995 by Maruzen), various methods have been proposed for the gettering technique.

The following are four representative methods for the gettering technique. A first method is a PBS (Polysilicon Back Sealing) method in which a polysilicon film is deposited on the back surface of the wafer, a second method is a phosphorus diffusion method in which high-concentration phosphorus is diffused from the back surface of the wafer, a third method is an IG (Internal Gettering) method of using crystal defects which occur due to oxygen precipitates in a Czochralski grown silicon wafer, and a fourth method is a p/p$^+$ epitaxial wafer method in which a high-concentration boron layer is used as a gettering layer. According to these gettering methods, heavy metal is captured by diffusing the heavy metal from the sub-surface of wafer in which MOS transistors are formed to the gettering layer at the inside or the back side of the wafer, whereby the contamination amount of the heavy metal in the wafer sub-surface is reduced. Thereafter, a gate oxide film is formed, so that the contamination amount of heavy metal to be taken into the oxide film can be reduced.

However, when the thickness of the gate oxide film is reduced due to microstructure of MOS transistors, even contamination of low-concentration heavy metal degrades the reliability of the oxide film. Such cases have been reported by Y. Shiramizu, M. Tanaka, S. Yamasaki, M. Nakamori, N. Aoto and H. Kitajima in "Ext. Abst. of Solid State Devices and Materials" (1996) 362–364, and by W. B. Henley, L. Jastrzebski and N. F. Haddad in "Journal of Non-crystalline Solids" 187(1995) 134–139. This shows that the reduction of the heavy metal impurity concentration in the wafer sub-surface by the conventional gettering techniques is insufficient to thin gate oxide films.

Further, it is Necessary to form shallow junction for advanced ULSIs. Therefore, the low temperature processes and the rapid thermal processes are required so that impurities to form p-type and n-type semiconductor regions are little diffused. This means that diffusion of the impurities of heavy metal hardly occurs. As a result, heavy metal is hardly diffused to the gettering layer at the inside or the back surface of the wafer, so that the gettering process does not progress.

SUMMARY OF THE INVENTION

The present invention has been implemented to overcome the above problem, and has an object to provide a semiconductor device manufacturing method which can form a thin gate oxide film having high reliability in fabricating MOS transistors on a silicon wafer, so that the yield is enhanced in a process of manufacturing LSIs which are designed in enhanced microstructure and highly integrated, and reliability of transistors are enhanced.

A semiconductor device manufacturing method according to a first aspect of the present invention comprises a step of subjecting silicon wafer to a heat treatment in an oxidation furnace to form a first silicon oxide film, a step of gradually cooling the silicon wafer having the first silicon oxide film formed thereon and then taking out the silicon wafer from the oxidation furnace, and a step of removing the first silicon oxide film on the silicon wafer and then forming a gate silicon oxide film. Particularly, the cooling temperature in the cooling step is set to 800° C. or less.

A semiconductor device manufacturing method according to a second aspect of the present invention comprises a step of subjecting silicon wafer to a heat treatment in an oxidation furnace to form a first silicon oxide film, a step of keeping the silicon wafer at a low temperature for a fixed time after the silicon wafer having the first silicon oxide film formed thereon is cooled, and then taking out the silicon wafer from the oxidation furnace, and a step of removing the first silicon oxide film on the silicon wafer and then forming a gate silicon oxide film. Particularly, the temperature at which the silicon wafer is kept for the fixed time is set to 800° C. or less.

When the silicon wafer is thermally oxidized, heavy metal impurities which are solid-solved in the wafer surface layer portion have such properties that they are segregated in a silicon oxide film or at the Si/SiO$_2$ interface. FIG. 7 is a graph showing a measurement result of iron (Fe) concentration in SIMS (Secondary Ion Mass Spectroscopy) after the silicon wafer which is beforehand contaminated with Fe is thermally oxidized at 850° C. As shown in FIG. 7, the concentration of Fe is higher in the silicon oxide film and at the Si/SiO$_2$ interface. $10^{15}$ cm$^{-3}$ is the detection limitation concentration of SIMS. In this example, the Fe concentration is set to a relatively high value. If the Fe concentration is reduced, it would be difficult to directly detect the heavy metal impurities by SIMS because the precision is insufficient, however, the same phenomenon also occurs even in the case where the Fe concentration is low. When this phenomenon occurs in the process of forming the gate silicon oxide film, the reliability of the gate silicon oxide film is degraded.

The present invention positively uses this phenomenon. The concentration of the heavy metal impurities in the wafer sub-surface is reduced before the gate silicon oxide film is formed so that the segregation of the heavy metal impurities into the gate silicon oxide film constituting the MOS transistor is suppressed. Therefore, as described with reference to the conventional technique, the heavy metal impurities existing in the wafer sub-surface are captured as much as possible by the gettering layer according to any one of the PBS method, the phosphorus diffusion method, the IG method and the p/p+ epitaxial method. Nevertheless, some amount of heavy metal remains in the wafer sub-surface. When the thickness of the gate silicon oxide film is reduced, the residual heavy metal impurities cannot be neglected. Therefore, a step of forming a silicon oxide film (thermally-oxidized film) before the gate silicon oxide film is formed is added. In this step, the heavy metal existing in the wafer surface layer portion is taken into the silicon oxide film as much as possible. The heavy metal thus taken is removed together with the silicon oxide film. Thereafter, the wafer is cleaned and then the gate silicon oxide film is formed. At this time, the heavy metal in the wafer sub-surface is reduced at maximum, so that the gate silicon oxide film having high reliability can be obtained.

In the present invention, the following method is used so that as much an amount of heavy metal as possible can be taken into the Si/SiO$_2$ interface. According to a first method, after the silicon oxide film is formed, the wafer having the silicon oxide film is gradually cooled to a low temperature. According to a second method, after the silicon oxide film is formed, the wafer having the silicon oxide film is cooled to a low temperature and then kept for a fixed time. In both methods, it is the purpose that a sufficient time is provided for the heavy metal existing in the wafer sub-surface to be diffused to the silicon oxide film and the Si/SiO$_2$ interface and segregated therein. Particularly at a low temperature, solid-solubility of the heavy metal impurities in silicon is low and thus the super-saturated heavy metal impurities are liable to be segregated. Therefore, it is effective to provide a sufficient time. It is proper that the temperature to which the wafer is gradually cooled and the temperature at which the wafer is kept for a fixed time are set to 800° C. or less, however, it is unfavorable that the temperature is less than 400° C. in consideration of throughput or the like. The low temperature keeping time is, for example, 0.5 to 2.0 hours. The gradual cooling is performed, for example, at the cooling rate of 20° C./min or less, preferably 10° C./min or less. It is preferable to perform the low temperature keeping and the gradual cooling under non-oxidative atmosphere such as N$_2$ gas atmosphere.

As described above, according to the present invention, the concentration of the heavy metal impurities in the wafer sub-surface are reduced by the conventional gettering method, and further the heavy metal impurities are segregated in the silicon oxide film and at the Si/SiO$_2$ interface and removed together with the silicon oxide film. After this process, the gate silicon oxide film is formed, so that the reliability thereof can be enhanced.

DETAILED DESCRIPTION OF THE PREFERRED EMBODIMENT

A preferred embodiment according to the present invention will be described with reference to the drawings.

FIGS. 1A to 1D are cross-sectional views of wafer which show a semiconductor device manufacturing process in step order to explain an embodiment of the present invention, and FIGS. 2A to 2D are cross-sectional views of the wafer which is subjected to a gettering treatment used in the embodiment. First, four kinds of wafer being used will be described.

Figure 2A:
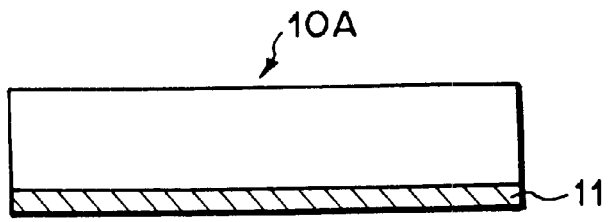
FIGS. 2A to 2D are cross-sectional views of a wafer to explain a gettering method.

PBS wafer 10A shown in FIG. 2A is used as a first wafer used in this embodiment. For example, the PBS wafer 10A is formed by forming a polysilicon film 11 of about 1 micrometer in thickness on a silicon wafer according to a CVD method and then polishing and removing the polysilicon film on the upper surface to leave the polysilicon film 11 only on the back surface.

Figure 2B:
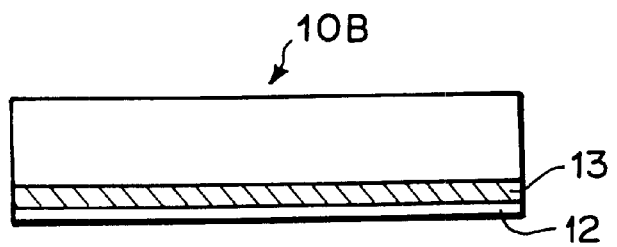

A phosphorus diffusion wafer 10B shown in FIG. 2B is used as a second wafer. For example, the phosphorus diffusion wafer 10B is formed by forming PSG film 12 on the back surface layer portion of the silicon wafer and then heating it at 850 to 900° C. for 10 to 15 minutes to form a phosphorus diffusion layer 13 containing phosphorus of $1 \times 10^{19}$/cm$^3$.

Figure 2C:
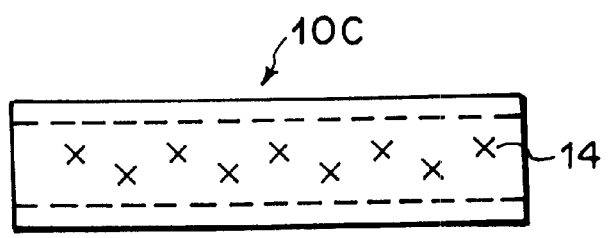
Figure 2D:
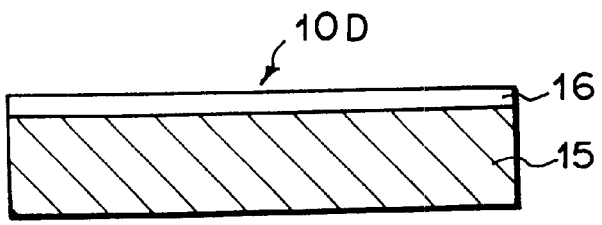
Figure 3:
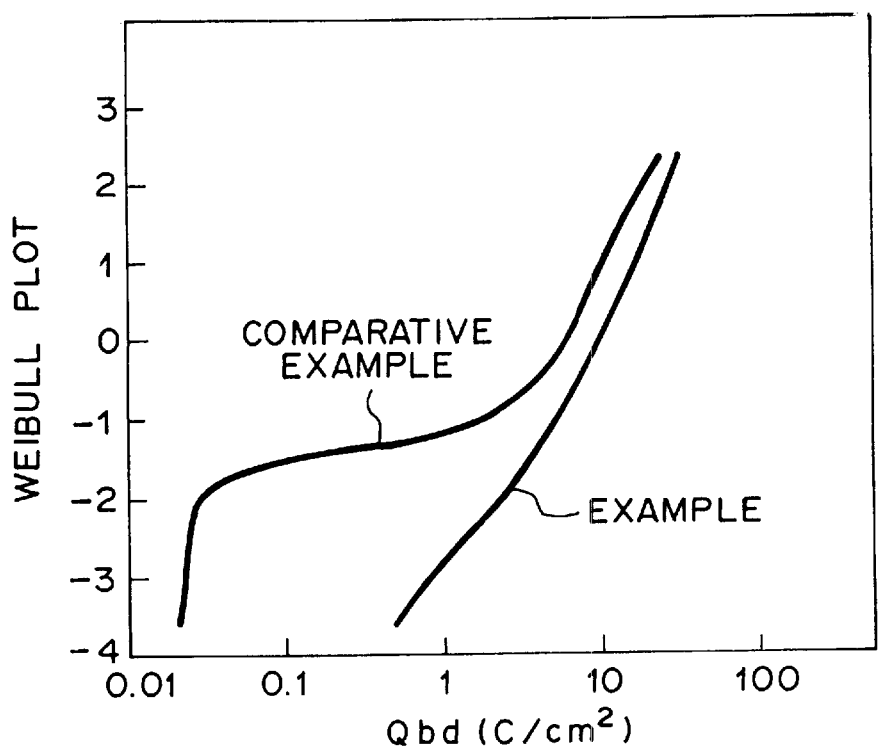
FIG. 3 is a graph showing a Weibull plot of Qbd when PBS wafer is used.
Figure 4:
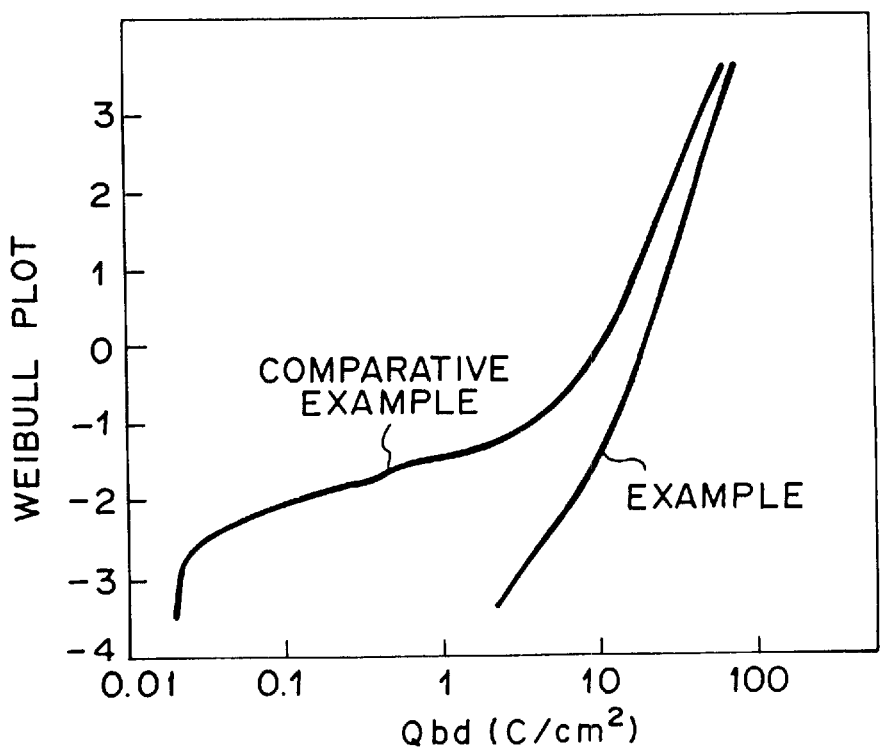
FIG. 4 is a graph showing a Weibull plot of Qbd when phosphorus diffusion wafer is used.
Figure 5:
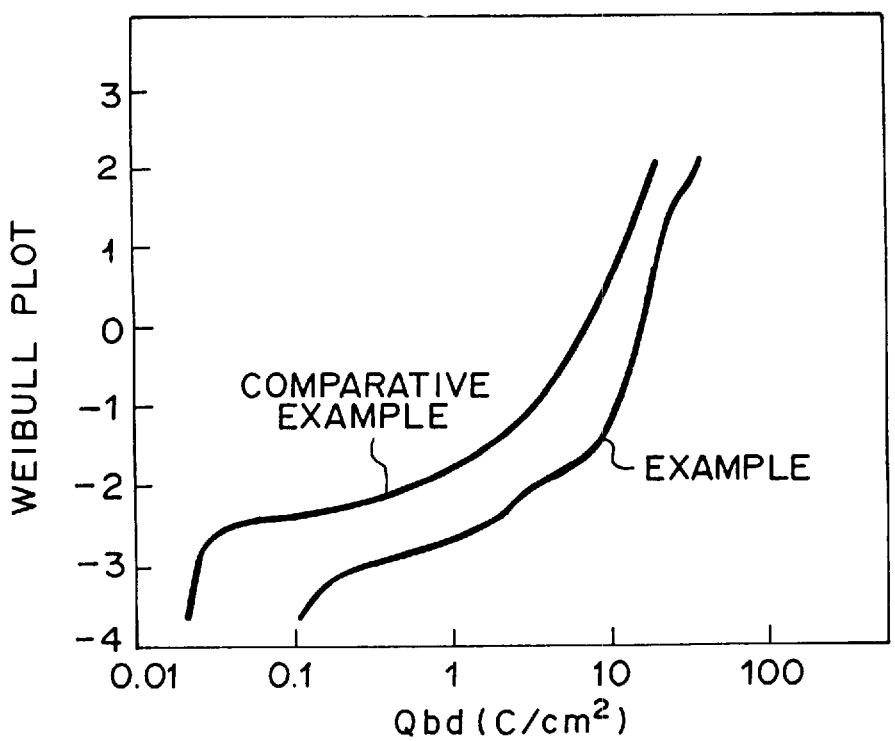
FIG. 5 is a graph showing a Weibull plot of Qbd when IG wafer is used.
Figure 6:
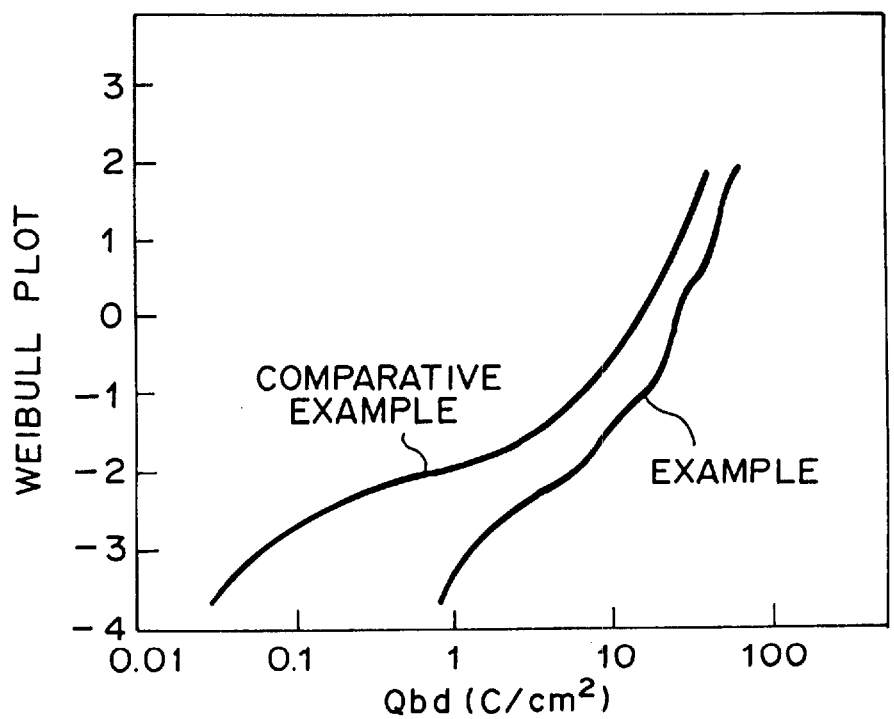
FIG. 6 is a graph showing a Weibull plot of Qbd when p/p+ epitaxial wafer is used.
Figure 7:
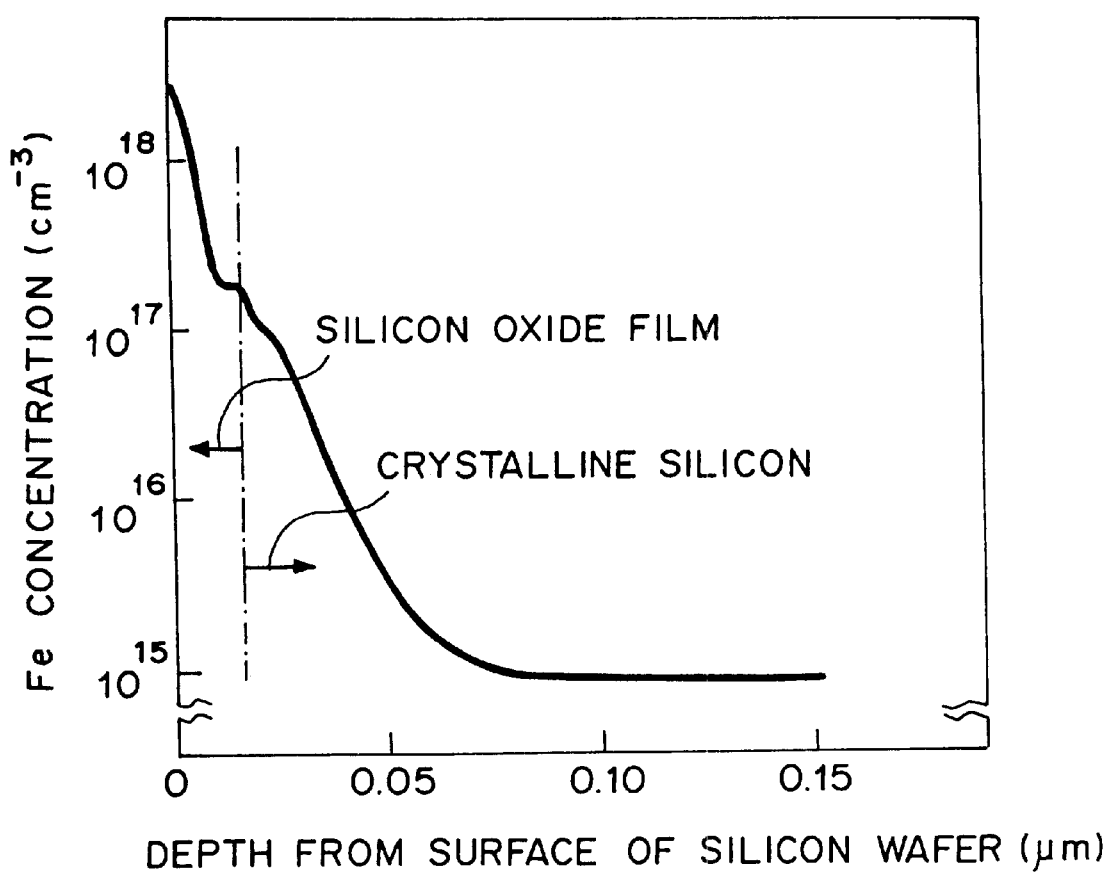
FIG. 7 is a graph showing an Fe distribution when a silicon oxide film is formed on a silicon wafer.

IG wafer 10C shown in FIG. 2C is used as a third wafer. For example, the IG wafer 10C is formed by performing a three-stage heat treatment at 1150° C. for 4 hours, at 650° C. for 4 hours and at 1000° C. for 4 hours to provide oxygen precipitates of $10^7$ to $10^8$/cm$^3$.

p/p+ epitaxial wafer 10D shown in FIG. 2D is used as a fourth wafer. For example, the p/p+ epitaxial wafer 10D is formed by forming an epitaxial layer 16 containing boron of about $10^{15}$/cm$^3$ and a thickness of about 5 micrometers on a high-concentration boron layer 15 (wafer) containing boron of about $10^{19}$/cm$^3$.

The embodiment according to the present invention will be described with reference to FIGS. 1A to 1D.

Figure 1A:
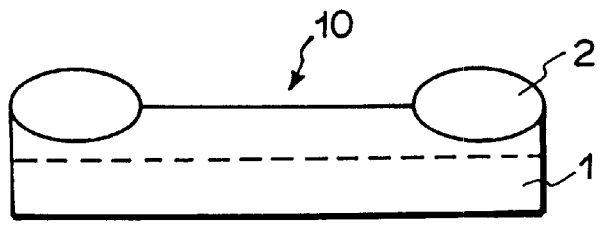
FIGS. 1A to 1D are cross-sectional views of a wafer to explain an embodiment of the present invention.

First, as shown in FIG. 1A, the gettering treatment is performed by using any one of the methods described with reference to FIGS. 2A to 2D to obtain a silicon wafer 10 having a gettering layer 1 formed therein, and an element separation oxide film 2 is formed on the surface of the wafer 10 by a selective oxidation method. Until this step, the wafer 10 may be contaminated with heavy metal impurities because it passes through various heat treatments, an ion implantation step for forming the well and adjusting the transistor threshold value, and an etching step. During the process of manufacturing a semiconductor device, the heavy metal impurities are captured to some extent by the gettering layer 1 which is beforehand provided in the wafer 10.

Figure 1B:
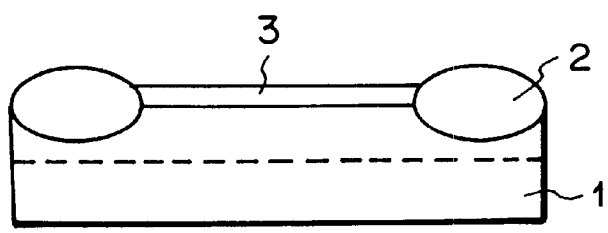

Subsequently, as shown in FIG. 1B, a first silicon oxide film 3 is formed, for example, at 850° C. to 950° C. In this step, after the first silicon oxide film 3 is formed, it is gradually cooled to a low temperature (800° C. or less), or it is kept for a fixed term after it is cooled to a low temperature. At this time, the heavy metal impurities are segregated in the first silicon oxide film 3 and at the interface between the first silicon oxide film 3 and the crystalline silicon.

Figure 1C:
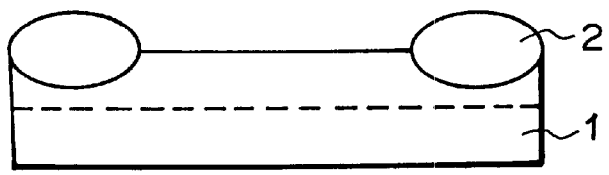

Thereafter, the first silicon oxide film 3 is removed and then the wafer 10 is cleaned, thereby obtaining a clean wafer sub-surface as shown in FIG. 1C.

Figure 1D:
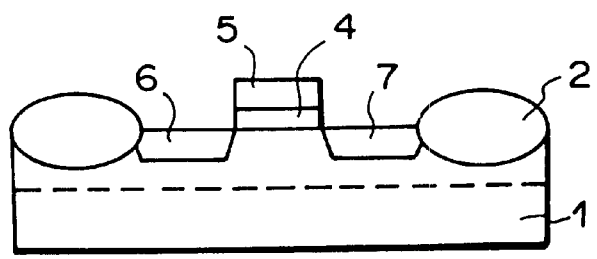

Subsequently, a gate silicon oxide film 4 is formed in the above state as shown in FIG. 1D, and then a gate electrode 5 formed of a polysilicon film or the like is formed on the gate silicon oxide film 4. Subsequently, ion implantation to form a source 6 and a drain 7 and a heat treatment to activate impurities thus doped are performed, thereby forming a basic MOS transistor.

Next, the characteristics of the MOS transistor manufactured according to the embodiment of the present invention will be estimated.

In this case, TDDB characteristic is estimated as the most basic estimation for reliability of the gate silicon oxide film. TDDB characteristic is described in detail in "Submicron Device" (written by Mitsumasa Koyanagi and issued by Maruzen, 1988). Describing qualitatively, a stress voltage is applied to the gate silicon oxide film to inject carriers little by little and estimate the time to the gate silicon oxide film breakdown.

FIGS. 3 to 6 show the TDDB characteristics when the thickness of the gate silicon oxide film is equal to 3 nm. In FIGS. 3 to 6, the abscissa (Qbd) represents the amount of electrons which are injected into the gate silicon oxide film until the insulation breakdown occurs, and the ordinate represents a Weibull plot $(\ln\{-\ln(1-F)\})$ of an accumulative fraction defective F of 200 transistors. FIGS. 3 to 6 show the TDDB characteristics of the PBS wafer, the phosphorus diffusion wafer, the IG wafer and the p/p$^+$ epitaxial wafer, respectively.

The first silicon oxide film 3 is formed at 950° C. FIGS. 3 to 6 show the comparison for the wafers based on the respective gettering methods between a comparative example in which the first silicon oxide film 3 is formed and then the wafer is taken out from the oxidation furnace at 800° C. and an example of the present invention in which the wafer is further gradually cooled to 600° C. and then taken out from the oxidation furnace. In any case, Qbd is reduced to be less in the example of the present invention where the wafer is gradually cooled to 600° C. That is, it has been proved that the reliability of the gate silicon oxide film is enhanced by taking out the wafer from the oxidation furnace at lower temperature after gradual cooling.

Next, there will be described experimental results which were obtained when the forming conditions of the first silicon oxide film 3 and the gate silicon oxide film 4 were changed.

The IG wafer 10C shown in FIG. 2C was used as the silicon wafer. Table 1 shows the forming condition of each silicon oxide film for 14 samples. As to "Take out" in Table 1, "to x ° C." means the gradual cooling to x ° C. at the cooling rate of 3° C./min and "x ° C.-yhr" means the keeping at x ° C. during y hours. Rapid thermal oxidation (RTO) as a method of forming the gate oxide film was conducted under dry condition (Dry).

TABLE 1

| | Silicon Oxide Film 3 | | Gate Silicon Oxide Film | |
|---|---|---|---|---|
| Sample No. | Oxidation/Take out | Thickness | Oxidation | Thickness |
| 1 | 950° C., Dry/to 700° C. | 10 nm | RTO | 3 nm |
| 2 | 950° C., Dry/to 500° C. | 10 nm | RTO | 3 nm |
| 3 | 850° C., Wet/800° C.-2 hr | 14 nm | 850° C., Wet | 3 nm |
| 4 | 850° C., Wet/700° C.-2 hr | 14 nm | 850° C., Wet | 3 nm |
| 5 | 850° C., Wet/600° C.-2 hr | 14 nm | 850° C., Wet | 3 nm |
| 6 | 850° C., Wet/600° C.-0.5 hr | 14 nm | 850° C., Wet | 3 nm |
| 7 | 850° C., Wet/600° C.-2 hr | 14 nm | 850° C., Wet | 2.5 nm |
| 8 | 850° C., Wet/600° C.-2 hr | 14 nm | 850° C., Wet | 4 nm |
| 9 | 850° C., Wet/600° C.-2 hr | 14 nm | 850° C., Wet | 6 nm |

TABLE 1-continued

| | Silicon Oxide Film 3 | | Gate Silicon Oxide Film | |
|---|---|---|---|---|
| Sample No. | Oxidation/Take out | Thickness | Oxidation | Thickness |
| 10 | 900° C., Dry/to 850° C. | 11 nm | 900° C., Dry | 4 nm |
| 11 | 900° C., Dry/to 800° C. | 11 nm | 900° C., Dry | 4 nm |
| 12 | 900° C., Dry/to 700° C. | 11 nm | 900° C., Dry | 4 nm |
| 13 | 900° C., Dry/to 600° C. | 11 nm | 900° C., Dry | 4 nm |
| 14 | 900° C., Dry/to 600° C. | 7 nm | 900° C., Dry | 4 nm |

The characteristic estimation of transistors manufactured by using the condition of Table 1 was performed according to the TDDB method. Table 2 shows the values of 50%Qbd of these examples. The Qbd value had a distribution for the measured transistors in each sample. For each sample, the value of 50%Qbd is equal to the value at the central position when the Qbd values of all the measured transistors are arranged in the order from the smallest value to the largest value. Samples for which no gradual cooling operation and no low-temperature keeping operation were performed in the step of forming the first silicon oxide film (the other steps were the same as examples of the present invention) were employed as comparative examples when comparing 50%Qbd.

TABLE 2

| Sample No. | 50% Qbd [C/cm$^2$] | Corresponding Comp. Example 50% Qbd [C/cm$^2$] |
|---|---|---|
| 1 | 8 | 4 |
| 2 | 9 | 4 |
| 3 | 8 | 6 |
| 4 | 10 | 6 |
| 5 | 13 | 6 |
| 6 | 11 | 6 |
| 7 | 10 | 5 |
| 8 | 14 | 9 |
| 9 | 21 | 13 |
| 10 | 8 | 8 |
| 11 | 10 | 8 |
| 12 | 12 | 8 |
| 13 | 14 | 8 |
| 14 | 13 | 8 |

For Sample No. 10, the first silicon oxide film was formed and then gradually cooled to 850° C., and it is apparent that 50%Qbd for this sample is not enhanced. For Sample No. 11 which was gradually cooled to 800° C., 50%Qbd was enhanced. Under the other conditions, as shown in Table 2, 50%Qbd was more enhanced in the case where the first silicon oxide film was formed and then gradually cooled or kept at a low temperature than in the case where neither the gradual cooling operation nor the low-temperature keeping operation was performed (Comp. Example in Table 2). Further, according to the present invention, it was confirmed that the reliability of the gate silicon oxide film was enhanced even when the forming method of the first silicon oxide film was set to Wet or Dry or even when the film thickness was varied. Further, the reliability was enhanced even when the gate oxidation method or the film thickness was varied.

Even when the first silicon oxide film was merely formed, the value of Qbd was slightly higher than the case where no first silicon oxide film was formed if the gradual cooling operation or the low-temperature keeping operation was not performed, and the effect was little confirmed.

In the examples shown in Table 1, the IG wafer was used. However, the same effect was obtained when the PBS wafer or the like shown in FIG. 2 was used.

As described above, according to the present invention, the reliability of the gate silicon oxide film can be prevented from being reduced due to the heavy metal impurities which are included in the semiconductor device manufacturing process. As a result, transistors having high reliability can be achieved. Further, the present invention is effective to an unintentional heavy metal contamination accident in an LSI manufacturing line, and enhance the yield of LSIs. As a result, the manufacturing cost of products can be reduced.

Further, the method of removing the heavy metal contaminants according to the present invention is based on the first silicon oxide film, so that the diffusion length of heavy metal may be short. Therefore, the present invention can support reduction of the thickness of the gate oxide film and lowering of the manufacturing process temperature which accompany the microstructure and the high integration of LSIs.

What is claimed is:

1. A semiconductor device manufacturing method comprising:
   a step of subjecting a silicon wafer to a heat treatment in an oxidation furnace to form a first silicon oxide film;
   a step of cooling the silicon wafer having the first silicon oxide film formed thereon under a non-oxidative atmosphere, wherein a first temperature to which the silicon wafer cooled in the cooling step is set to 800° C. or less, and then taking out the silicon wafer from the oxidation furnace; and
   a step of removing the first silicon oxide film on the silicon wafer and then forming a gate silicon oxide film.

2. The semiconductor device manufacturing method as claimed in claim 1, further comprising the step of, prior to the step of subjecting the silicon wafer to the heat treatment, subjecting the silicon wafer to a heavy-metal gettering treatment.

3. The semiconductor device manufacturing method as claimed in claim 2, wherein the heavy-metal gettering treatment is performed by a polysilicon film which is deposited on the back surface of the silicon wafer.

4. The semiconductor device manufacturing method as claimed in claim 2, wherein the heavy-metal gettering treatment is performed by oxygen precipitates in the silicon wafer.

5. The semiconductor device manufacturing method as claimed in claim 2, wherein the heavy-metal gettering treatment is performed by a first-concentration boron layer in the silicon wafer.

6. The semiconductor device manufacturing method as claimed in claim 2, wherein the heavy-metal gettering treatment is performed by a first-concentration phosphorus diffusion layer in the silicon wafer.

7. A semiconductor device manufacturing method comprising:
   a step of subjecting a silicon wafer to a heat treatment in an oxidation furnace to form a first silicon oxide film;
   a step of keeping the silicon wafer at a first temperature for a fixed time under a non-oxidative atmosphere after cooling the silicon wafer having the first silicon oxide film formed thereon under a non-oxidative atmosphere, wherein said first temperature at which the silicon wafer is kept for the fixed time is set to 800° C. or less, and then taking out the silicon wafer from the oxidation furnace; and
   a step of removing the first silicon oxide film on the silicon wafer and then forming a gate silicon oxide film.

8. The semiconductor device manufacturing method as claimed in claim 7, further comprising the step of, prior to the step of subjecting the silicon wafer to the heat treatment, subjecting the silicon wafer to a heavy-metal gettering treatment.

9. The semiconductor device manufacturing method as claimed in claim 8, wherein the heavy-metal gettering treatment is performed by a polysilicon film which is deposited on the back surface of the silicon wafer.

10. The semiconductor device manufacturing method as claimed in claim 8, wherein the heavy-metal gettering treatment is performed by oxygen precipitates in the silicon wafer.

11. The semiconductor device manufacturing method as claimed in claim 8, wherein the heavy-metal gettering treatment is performed by a first-concentration boron layer in the silicon wafer.

12. The semiconductor device manufacturing method as claimed in claim 8, wherein the heavy-metal gettering treatment is performed by a first-concentration phosphorus diffusion layer in the silicon wafer.

* * * * *